(12) United States Patent
Fontana, Jr. et al.

(10) Patent No.: US 7,635,599 B2
(45) Date of Patent: Dec. 22, 2009

(54) THREE TERMINAL MAGNETIC SENSING DEVICES HAVING BASE LEAD LAYERS IN-PLANE WITH COLLECTOR SUBSTRATE MATERIALS AND METHODS OF MAKING THE SAME

(75) Inventors: Robert E. Fontana, Jr., San Jose, CA (US); Jui-Lung Li, San Jose, CA (US); Jeffrey S. Lille, Sunnyvale, CA (US); Sergio Nicoletti, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 514 days.

(21) Appl. No.: 11/239,178

(22) Filed: Sep. 29, 2005

(65) Prior Publication Data

US 2007/0238198 A1    Oct. 11, 2007

(51) Int. Cl.
*H01L 21/00*    (2006.01)
(52) U.S. Cl. .................. 438/3; 257/423; 257/E21.665
(58) Field of Classification Search .............. 257/427, 257/E21.665, 423, 421; 438/3
See application file for complete search history.

(56) References Cited

U.S. PATENT DOCUMENTS

| | | | | |
|---|---|---|---|---|
| 5,444,014 | A * | 8/1995 | Ryum et al. | 438/311 |
| 5,506,157 | A * | 4/1996 | Lee et al. | 438/348 |
| 5,696,007 | A * | 12/1997 | Ryum et al. | 438/320 |
| 5,846,867 | A * | 12/1998 | Gomi et al. | 438/318 |
| 5,962,879 | A * | 10/1999 | Ryum et al. | 257/198 |
| 6,190,984 | B1 * | 2/2001 | Ryum et al. | 438/309 |
| 6,337,494 | B1 * | 1/2002 | Ryum et al. | 257/197 |
| 6,562,688 | B2 * | 5/2003 | Han et al. | 438/320 |
| 6,577,476 | B1 | 6/2003 | Childress et al. | |
| 6,586,818 | B1 * | 7/2003 | Voldman | 257/587 |

(Continued)

*Primary Examiner*—Kiesha L. Rose
*Assistant Examiner*—Igwe U Anya
(74) *Attorney, Agent, or Firm*—John Oskorep, Esq.; Ramhod Nader

(57) ABSTRACT

Three terminal magnetic sensing devices (TTMs) having base lead layers in-plane with collector substrate materials, and methods of making the same, are disclosed. In one illustrative example, a collector substrate having an elevated region and a recessed region adjacent the elevated region is provided. An insulator layer is formed in full-film over the collector substrate, and a base lead layer is formed in full-film over the insulator layer and in-plane with semiconductor materials of the elevated region. The insulator materials and the base lead materials that are formed over the elevated region are removed. A sensor stack structure having an emitter region and a base region is then formed over the elevated region such that part of the base region is formed over an end of the base lead layer. A base conductive via may be formed to contact base lead materials of the base lead layer at a suitable distance away from the sensor stack structure. Advantageously, the base conductive via formation may occur without causing damage to the sensor stack structure. Also, the base lead layer is formed in the recessed region of the collector substrate prior to the formation of the sensor stack structure such that the TTM may be entirely in-situ manufactured. Furthermore, the trackwidth of the TTM may be defined directly by the elevated region of the collector substrate. The TTM is suitable for incorporation into nanoscale devices which increase areal recording densities, therefore aiding the revolution in magnetic storage.

21 Claims, 8 Drawing Sheets

U.S. PATENT DOCUMENTS

| | | |
|---|---|---|
| 7,508,000 B2 * | 3/2009 | Van Zeghbroeck et al. .... 257/77 |
| 2002/0079510 A1 * | 6/2002 | Han et al. ................... 257/197 |
| 2003/0053270 A1 | 3/2003 | Gill |
| 2003/0062580 A1 | 4/2003 | Sato et al. |
| 2004/0105194 A1 | 6/2004 | Fontana et al. |
| 2004/0124484 A1 | 7/2004 | Sato et al. |
| 2005/0040497 A1 * | 2/2005 | Takubo et al. ............... 257/618 |

* cited by examiner

THREE TERMINAL MAGNETIC SENSING DEVICES HAVING BASE LEAD LAYERS IN-PLANE WITH COLLECTOR SUBSTRATE MATERIALS AND METHODS OF MAKING THE SAME

BACKGROUND

1. Field of the Technology

The present application relates generally to three terminal magnetic sensors (TTMs) suitable for use in magnetic heads, and more specifically to TTMs having base lead layers in-plane with collector substrate materials.

2. Description of the Related Art

Magnetoresistive (MR) sensors have typically been used as read sensors in hard disk drives. An MR sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the disk in a disk drive, because the external field from the recorded magnetic medium (the signal field) causes a change in the direction of magnetization in the read element, which causes a change in resistance of the read element and a resulting change in the sensed current or voltage.

A three terminal magnetic (TTM) sensing device of a magnetic head may comprise a spin valve transistor (SVT), for example, which is a vertical spin injection device having electrons injected over a barrier layer into a free layer. The electrons undergo spin-dependent scattering, and those that are only weakly scattered retain sufficient energy to traverse a second barrier. The current over the second barrier is referred to as the magneto-current. Conventional SVTs are constructed using a traditional three-terminal framework having an "emitter-base-collector" structure of a bipolar transistor. SVTs further include a spin valve (SV) on a metallic base region, whereby the collector current is controlled by the magnetic state of the base region using spin-dependent scattering. Although the TTM may involve an SVT where both barrier layers are Schottky barriers, the TTM may alternatively incorporate a magnetic tunnel transistor (MTT) where one of the barrier layers is a Schottky barrier and the other barrier layer is a tunnel barrier, or a double junction structure where both barrier layers are tunnel barriers.

FIG. 1 illustrates TTM operation associated with a conventional SVT 100 which has a semiconductor emitter region 102, a semiconductor collector region 104, and a base region 106 which contains a spin valve. The semiconductors and magnetic materials used in SVT 100 may include an n-type silicon (Si) material for emitter 102 and collector 104, and a $Ni_{80}Fe_{20}/Au/Co$ spin valve for the region 106. Energy barriers, also referred to as Schottky barriers, are formed at the junctions between the metal base 106 and the semiconductors. It is desirable to obtain a high quality energy barrier at these junctions with good rectifying behavior. Therefore, thin layers of materials (e.g. platinum and gold) are oftentimes used at the emitter 102 and collector 104, respectively. Moreover, these thin layers separate the magnetic layers from the semiconductor materials.

A TTM operates when current is introduced between emitter region 102 and base region 106, denoted as $I_E$ in FIG. 1. This occurs when electrons are injected over the energy barrier and into base region 106 by biasing the emitter such that the electrons are traveling perpendicular to the layers of the spin valve. Because the electrons are injected over the energy barrier, they enter base region 106 as non-equilibrium hot electrons, whereby the hot-electron energy is typically in the range of 0.5 and 1.0 eV depending upon the selection of the metal/semiconductor combination. The energy and momentum distribution of the hot electrons change as the electrons move through base region 106 and are subjected to inelastic and elastic scattering. As such, electrons are prevented from entering collector region 104 if their energy is insufficient to overcome the energy barrier at the collector side. Moreover, the hot-electron momentum must match with the available states in the collector semiconductor to allow for the electrons to enter collector region 104. The collector current $I_C$, which indicates the fraction of electrons collected in collector region 104, is dependent upon the scattering in base region 106 which is spin-dependent when base region 106 contains magnetic materials. Furthermore, an external applied magnetic field controls the total scattering rate which may, for example, change the relative magnetic alignment of the two ferromagnetic layers of the spin valve. The magnetocurrent (MC), which is the magnetic response of the TTM, can be represented by the change in collector current normalized to the minimum value as provided by the following formula: $MC=[I^P_C-I^{AP}_C]/I^{AP}_C$, where P and AP indicate the parallel and antiparallel state of the spin valve, respectively. Since these types of devices have small output currents due to the small differences between the two Schottky barrier heights of the semiconductor, MTT and double Tunnel embodiments are generally preferred.

In FIG. 2, a cross-sectional view of a conventional TTM 200 of the MTT type is shown. TTM 200 of FIG. 2 has a base region 215, a semiconductor collector substrate 220 which is adjacent base region 215, an emitter region 205, and a barrier region 210 which separates emitter region 205 from base region 215. Base region 215, barrier region 210, and emitter region 205 form a sensor stack structure 201 of TTM 200. A first Schottky barrier 211 is formed at the interface between base region 215 and semiconductor collector substrate 220. Also, a second Tunnel barrier 212 is formed within sensor stack structure 201 at the interface between emitter region 205 and base region 215 at barrier layer 210 in a single deposition step. An emitter conductive via 235 is formed adjacent emitter region 205 of sensor stack structure 201, a collector conductive via 236 is formed adjacent semiconductor collector substrate 220, and a base conductive via 234 is formed by etching the sensor stack layer structure down to base region 215. Insulator materials 250 surround the various structures of TTM 200.

In FIG. 3, a cross-sectional view of an alternative conventional TTM 300 of the SVT type is shown. TTM 300 of FIG. 3 has a base region 315, a semiconductor collector substrate 320 which is adjacent base region 315, an emitter region 305, and a barrier region 310 which separates emitter region 305 from base region 315. Base region 315, barrier region 310, and emitter region 305 form a sensor stack structure 301 of TTM 300. A first Schottky barrier 311 is formed at the interface between base region 315 and semiconductor collector substrate 320 to define the geometry of base region 315. Also, a second Tunnel barrier 312 is formed at least partly over base region 315 at barrier layer 310 to therefore form emitter region 305 with an ex-situ process. An emitter conductive via 335 is formed adjacent emitter region 305 of sensor stack structure 301, and a collector conductive via 336 is formed adjacent semiconductor collector substrate 320. A base conductive via 334 is formed by etching the sensor stack structure down to base region 315. Insulator materials 350 surround the various structures of TTM 300.

In general, sensor stack structures are fragile and susceptible to damage due to ion bombardment and chemical exposure during manufacturing steps such as those used in the formation of conductive vias for connecting TTM base regions to their terminals. Metal layers involved in TTMs are generally within 5 nm and 10 nm thick, such that subtractive processes usually required to shape these devices can change the magnetic properties of the metal layers. Furthermore, in conventional TTMs 200 and 300 of FIGS. 2 and 3, base regions 215 and 315 are formed relatively longer than their respective emitter regions 205 and 305. This difference in length is necessary to facilitate the formation of base region conductive vias 234 and 334 while avoiding damage to sensor stack structures 201 and 301 associated with ion bombardment and chemical exposure. As a result, the trackwidths are unnecessarily large due to the relatively long length of the base regions. It is advantageous to form very thin and narrow base regions in TTMs for increased areal recording densities and smaller trackwidths.

Accordingly, there is a need to solve these problems so that TTMs may be suitable for use in magnetic heads and other devices.

SUMMARY

Three terminal magnetic sensing devices (TTMs) having base lead layers in-plane with collector substrate materials, and methods of making the same, are disclosed. In one illustrative example, a collector substrate having an elevated region and a recessed region adjacent the elevated region is provided. An insulator layer is formed in full-film over the collector substrate, and a base lead layer is formed in full-film over the insulator layer and in-plane with semiconductor materials of the elevated region. The insulator materials and the base lead materials formed over the elevated region are then removed. Next, a sensor stack structure having an emitter region and a base region is formed over the elevated region such that part of the base region is formed over an end of the base lead layer. A base conductive via may be formed to contact base lead materials of the base lead layer at a suitable distance away from the sensor stack structure.

Advantageously, the base conductive via formation may occur without causing damage to the sensor stack structure. Also, the base lead layer is formed in the recessed region of the collector substrate prior to the formation of the sensor stack structure such that the TTM may be entirely in-situ manufactured. Furthermore, the trackwidth of the TTM is defined directly by the elevated region of the collector substrate. The TTM is suitable for incorporation into nanoscale devices which increase areal recording densities, therefore aiding the revolution in magnetic storage.

BRIEF DESCRIPTION OF THE DRAWINGS

Other objects and advantages of the invention will become more apparent to those skilled in the art after considering the following detailed description in connection with the accompanying drawings.

DETAILED DESCRIPTION OF THE PREFERRED EMBODIMENTS

Three terminal magnetic sensing devices (TTMs) having base lead layers in-plane with collector substrate materials, and methods of making the same, are disclosed. In one illustrative example, a collector substrate having an elevated region and a recessed region adjacent the elevated region is provided. An insulator layer is formed in full-film over the collector substrate, and a base lead layer is formed in full-film over the insulator layer and in-plane with semiconductor materials of the elevated region. The insulator materials and the base lead materials formed over the elevated region are then removed. Next, a sensor stack structure having an emitter region and a base region is formed over the elevated region such that part of the base region is formed over an end of the base lead layer. A base conductive via may be formed to contact base lead materials of the base lead layer at a suitable distance away from the sensor stack structure. Advantageously, the base conductive via formation may occur without causing damage to the sensor stack structure. Also, the base lead layer is formed in the recessed region of the collector substrate prior to the formation of the sensor stack structure such that the TTM may be entirely in-situ manufactured. Furthermore, the trackwidth of the TTM is defined directly by the elevated region of the collector substrate. The TTM is suitable for incorporation into nanoscale devices which increase areal recording densities, therefore aiding the revolution in magnetic storage.

The following description is an exemplary embodiment for carrying out the present invention. This description is made for the purpose of illustrating the general principles of the present invention and is not meant to limit the inventive concepts claimed herein.

Figure 1:
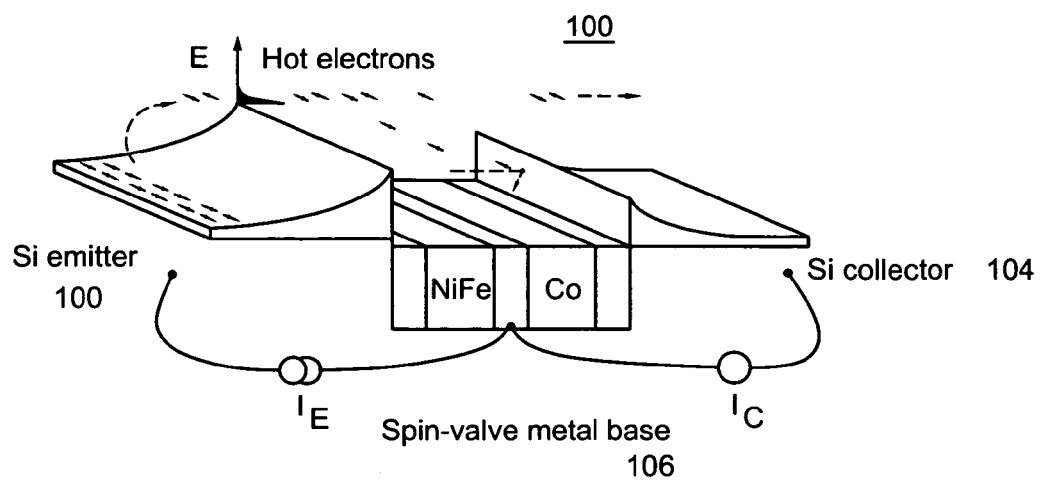
FIG. 1 is an illustration of general three terminal magnetic sensing device (TTM) operation.
Figure 2:
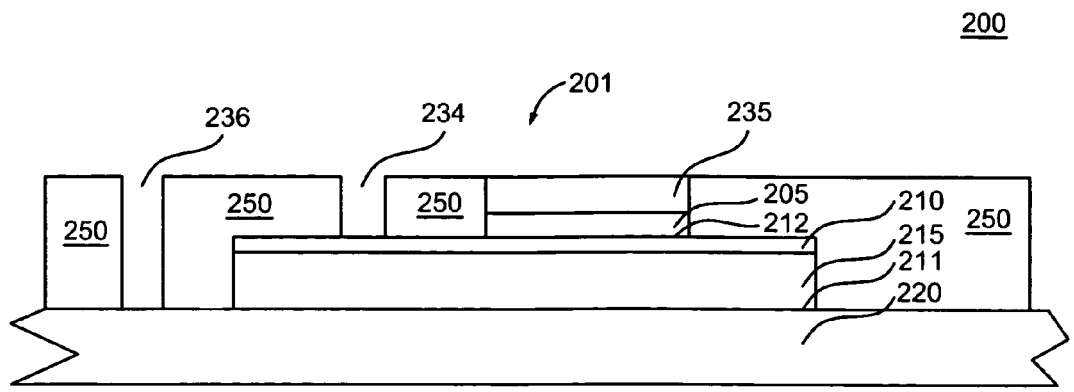
FIG. 2 is a cross-sectional view of a prior art magnetic head having a TTM.
Figure 3:
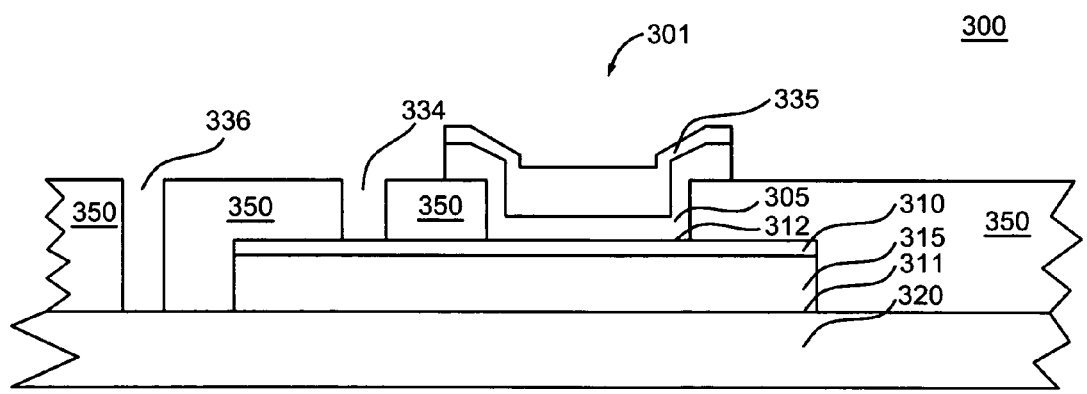
FIG. 3 is a cross-sectional view of a prior art magnetic head having a TTM.
Figure 4:
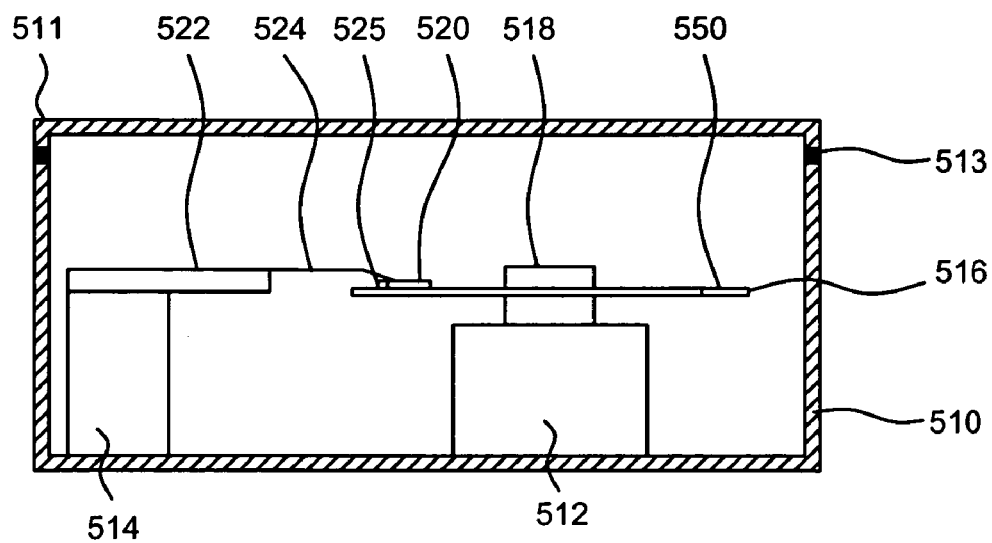
FIG. 4 is a cross-sectional view of a magnetic head of a disk drive which may embody a TTM having base lead layers in-plane with collector substrate materials.
Figure 5:
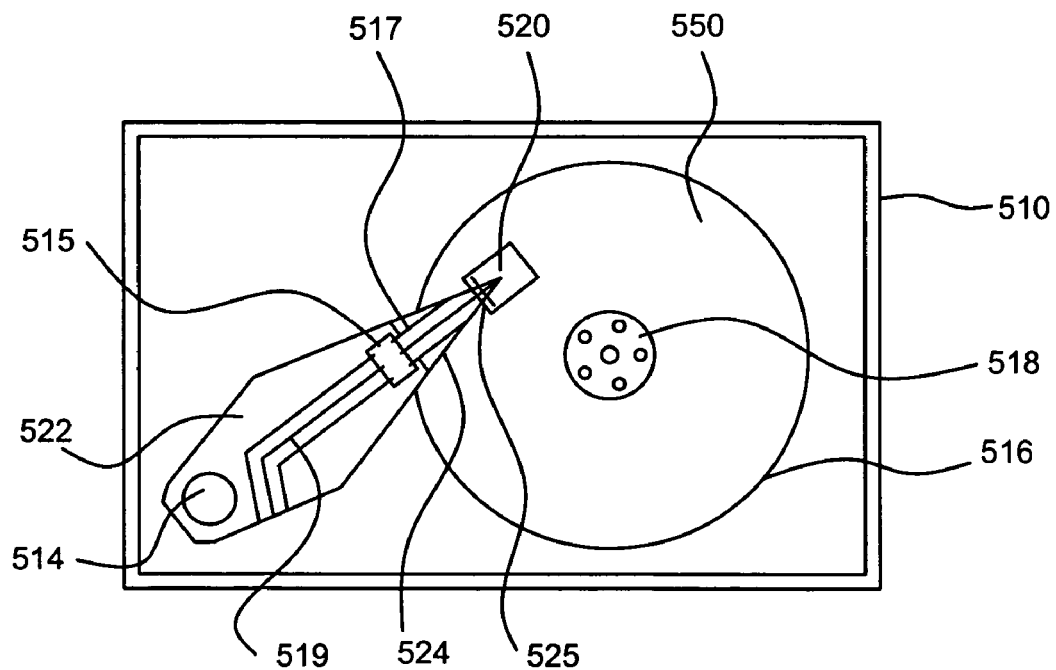
FIG. 5 is a top-down view of the disk drive of FIG. 4.

FIG. 4 is a simplified block diagram of a conventional magnetic recording disk drive for use with a three terminal magnetic sensing device (TTM) of a magnetic head. FIG. 5 is a top view of the disk drive of FIG. 4 with the cover removed. Referring first to FIG. 4, there is illustrated in a sectional view a schematic of a conventional disk drive of the type using a TTM. The disk drive comprises a base 510 to which are secured a disk drive motor 512 and an actuator 514, and a cover 511. Base 510 and cover 511 provide a substantially sealed housing for the disk drive. Typically, there is a gasket 513 located between base 510 and cover 511 and a small breather port (not shown) for equalizing pressure between the interior of the disk drive and the outside environment. A magnetic recording disk 516 is connected to drive motor 512 by means of a hub 518 to which it is attached for rotation by drive motor 512. A thin lubricant film 550 is maintained on the surface of disk 516. A read/write head or transducer 525 is formed on the trailing end of a carrier, such as an air-bearing slider 520. Transducer 525 is a read/write head comprising an inductive write head portion and a read head portion. Slider 520 is connected to actuator 514 by means of a rigid arm 522 and a suspension 524. Suspension 524 provides a biasing force which urges slider 520 onto the surface of the recording disk 516. During operation of the disk drive, drive motor 512 rotates disk 516 at a constant speed, and actuator 514, which is typically a linear or rotary voice coil motor (VCM), moves slider 520 generally radially across the surface of disk 516 so that read/write head 525 may access different data tracks on disk 516.

FIG. 5 illustrates in better detail suspension 524 which provides a force to slider 520 to urge it toward disk 516. Suspension 524 may be a conventional type of suspension, such as the well-known Watrous suspension, as described in U.S. Pat. No. 4,167,765. This type of suspension also provides a gimbaled attachment of the slider which allows the slider to pitch and roll as it rides on the air bearing surface. The data detected from disk 516 by transducer 525 is processed into a data readback signal by signal amplification and processing circuitry in an integrated circuit chip 515 located on arm 522. The signals from transducer 525 travel via a flex cable 517 to chip 515, which sends its output signals to the disk drive electronics (not shown) via cable 519.

Figure 6:
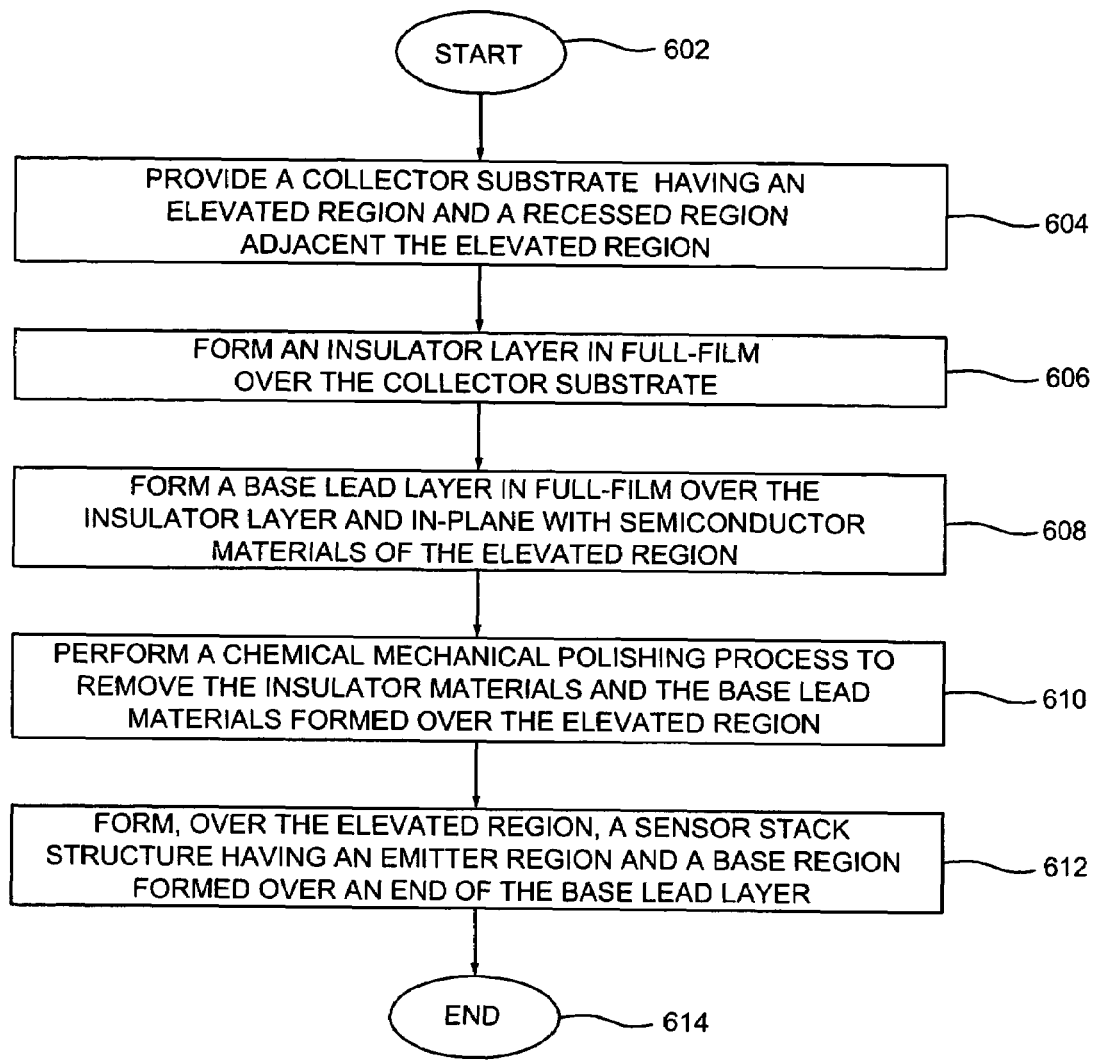
FIG. 6 is a flowchart which describes a fabrication process for a TTM having base lead layers in-plane with collector substrate materials.

FIG. 6 is a flowchart which describes a fabrication process for an exemplary TTM having base lead layers in-plane with collector substrate materials. FIGS. 7-11, which are a series of ABS illustrations taken along line 7-7 showing partially-fabricated sensing device structures corresponding to the steps described in the flowchart of FIG. 6, will be referred to in combination with the flowchart steps of FIG. 6.

Figure 7:
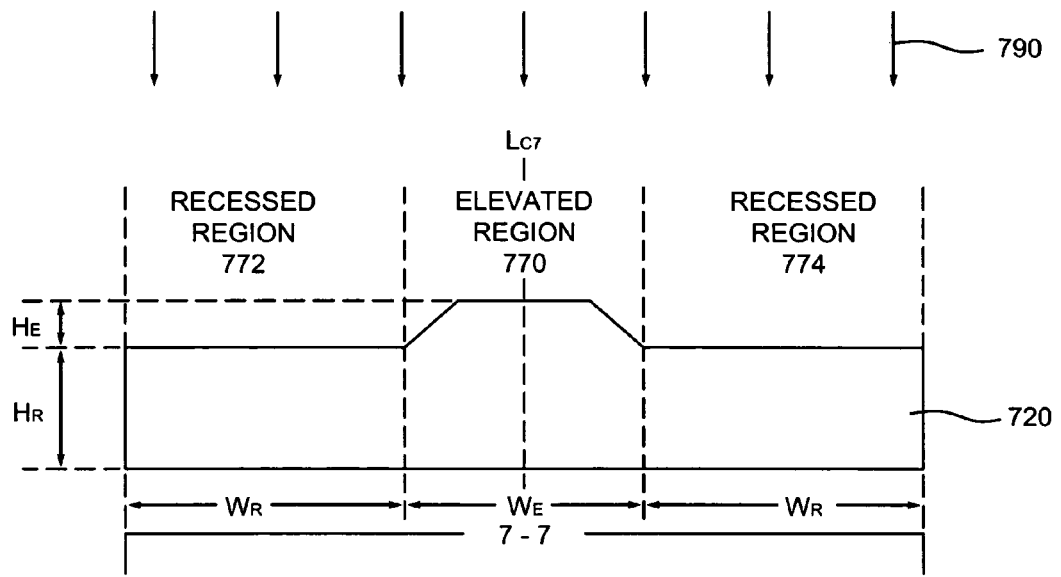
FIG. 7 is the first in a series of ABS illustrations of FIGS. 7-11 of partially fabricated TTM structures corresponding to the steps described in the flowchart of FIG. 6, showing a collector substrate having an elevated region and a recessed region adjacent the elevated region.

Beginning at a start block 602 of FIG. 6 in combination with FIG. 7, a collector substrate 720 having an elevated region 770 and first and second recessed regions 772 and 774 adjacent elevated region 770 is provided (step 604 of FIG. 6). Collector substrate 720 may be made of a wafer of any suitable semiconductor material such as silicon (Si), gallium arsenide (GaAs), or other.

Collector substrate 720 may be made by forming a resist structure over a central region of a collector substrate which exposes collector substrate materials over a first and second side of the collector substrate. With the resist structure in place, an etching process is performed to remove the exposed collector substrate materials to thereby form elevated region 770 and recessed regions 772 and 774. This etching process may be a wet etching process, a reactive ion etching (RIE) process, an ion milling process, or any other suitable removal process. The resist structure may be or include a photoresist. The resist structure may be a monolayer resist or a multi-layered resist (e.g. bilayer or trilayer resist). If photolithography is used to form the resist structure, a thin film of resist is light-exposed in regions which are to be removed, provided the resist is a positive resist. If the resist is a negative resist, it is light-exposed in regions that are to be retained. Finally, the resist is subjected to a basic developer solution. The resist structure is formed over the central region so as to define a width $W_E$ for subsequently-formed elevated region 770. Width $W_E$ of elevated region preferably is 100 nanometers. (nm), but may alternatively be within 10 nm and 50 nm. A height $H_E$ of elevated region preferably is about 10 nm, but may alternatively be within 10 nm and 100 nm Thus, elevated region 770 is formed on collector substrate 720 (which is at a centerline $L_{C7}$ of the width of collector substrate 720 and the trackwidth of the resulting TTM). In this exemplary embodiment, the resist structure is then removed.

Figure 8:
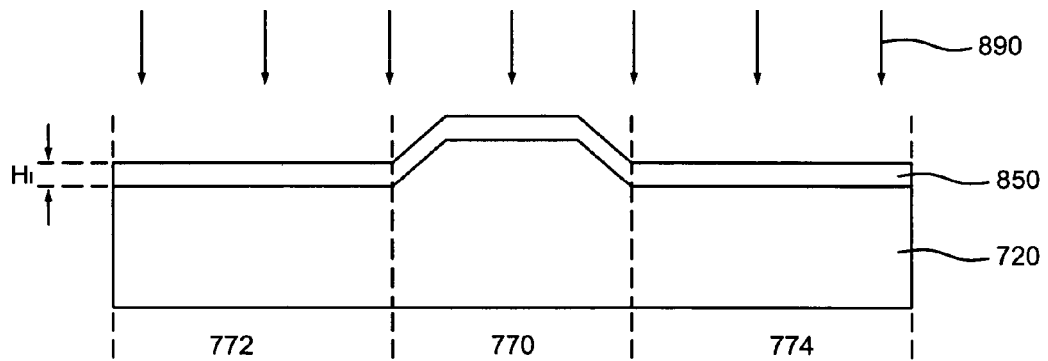
FIG. 8 is the second in a series of ABS illustrations of FIGS. 7-11 of partially fabricated TTM structures corresponding to the steps described in the flowchart of FIG. 6, showing an insulator layer formed in full-film over the collector substrate.

Next, a formation process 790 is performed in-situ to deposit insulator materials in full-film over and in contact with collector substrate 720 (step 606 of FIG. 6). The result is shown in FIG. 8, showing an insulator layer 850 formed to a thickness $H_I$. Preferably, insulator layer 850 is sputter deposited on top of collector substrate 720. Alternatively, other suitable deposition techniques may be used, such as ion beam sputtering, evaporation, atomic layer deposition, or chemical vapor deposition. In this exemplary embodiment, insulator layer 850 is made of alumina ($Al_2O_3$), but alternatively may be made with any suitable insulator material such as silicon dioxide ($SiO_2$), silicon nitride ($Si_3N_4$), aluminum nitride (AlN), zirconium oxide ($ZrO_2$), hafnium oxide ($HfO_x$), and yttrium oxide ($Y_2O_3$). Thickness $H_I$ of insulator layer 850 preferably is about 30 nm, but may alternatively be within 20 nm and 50 nm.

Figure 9:
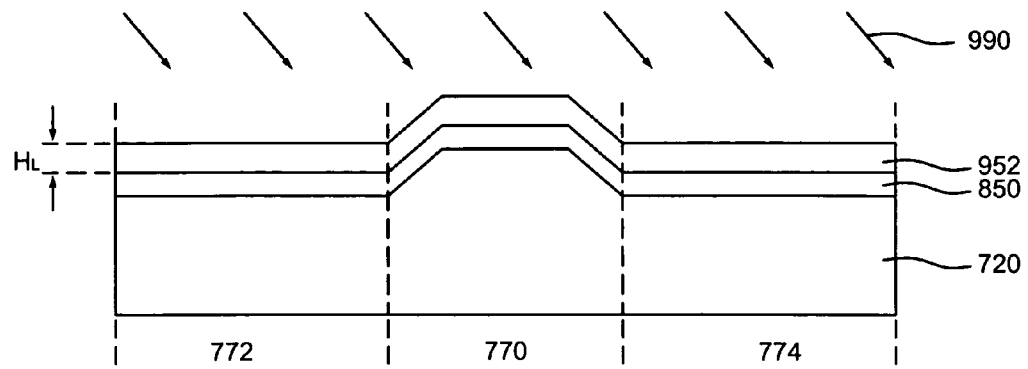
FIG. 9 is the third in a series of ABS illustrations of FIGS. 7-11 of partially fabricated TTM structures corresponding to the steps described in the flowchart of FIG. 6, showing a base lead layer formed in full-film over the insulator layer and in-plane with semiconductor materials of the elevated region.

Referring to FIG. 8, a formation process 890 is then performed in-situ to deposit base lead materials in full-film over insulator layer 850 and in-plane with semiconductor materials of elevated region 770 of collector substrate 720 (step 608 of FIG. 6). The result is shown in FIG. 9, where a base lead layer 952 is formed to a thickness $H_L$. Preferably, base lead layer 952 is sputter deposited on top of insulator layer 850. Alternatively, other suitable deposition techniques may be used, such as ion beam sputtering, evaporation, or chemical vapor deposition. In this exemplary embodiment, base lead layer 952 is made of a non-magnetic electrically conductive material such as copper (Cu), but alternatively may be made with any suitable electrically conductive metallic, alloyed or semiconducting non-magnetic material. Thickness $H_L$ of base lead layer 952 preferably is about 40 nm, but may alternatively be within 20 nm and 100 nm. Note that base lead layer 952 is formed in recessed regions 772 and 774 in-plane with semiconductor materials of semiconductor substrate 720.

Figure 10:
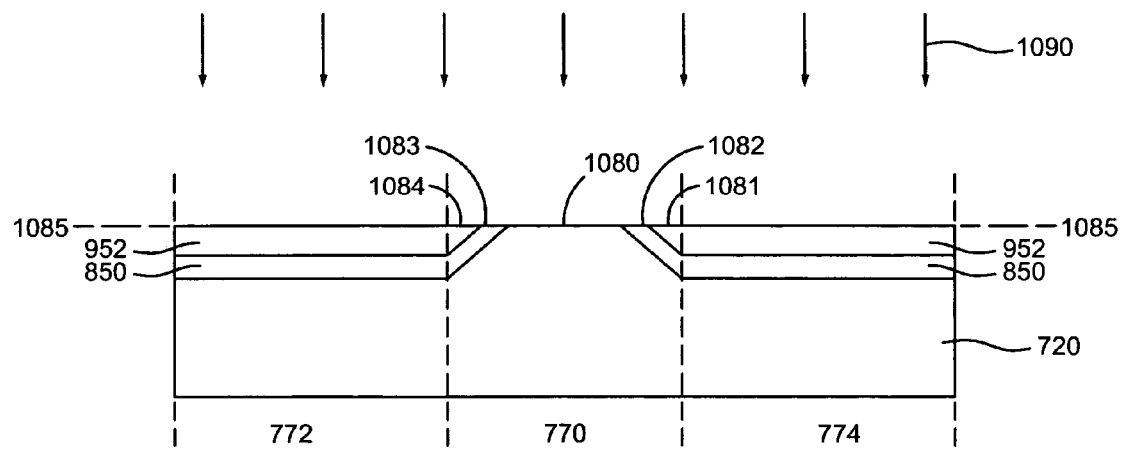
FIG. 10 is the fourth in a series of ABS illustrations of FIGS. 7-11 of partially fabricated TTM structures corresponding to the steps described in the flowchart of FIG. 6, showing the insulator materials and base lead materials formed over the elevated region removed.

Next in FIG. 9, a planarization process 990 such as a chemical mechanical polishing (CMP) process is performed in-situ to remove the insulator materials of insulator layer 850 and base lead materials of base lead layer 952 in elevated region 770 (step 610 of FIG. 6). The result is shown in FIG. 10, where the CMP process planarizes portions of the materials so as to form a planarized surface 1085 and exposes a top surface 1080 of elevated region 770. This process further exposes first and second ends 1082 and 1083 of insulator layer 850 near elevated region 770, as well as first and second ends 1081 and 1084 of base lead layer 850. In this exemplary embodiment, ends 1081, 1082, 1083, and 1084 are formed coplanar with top surface 1080 of elevated region 770.

The CMP process of step 610 of FIG. 6 may be performed with a conformable polishing pad in conjunction with a chemical slurry. The pad is passed over the work-in-progress to perform the polishing. This type of polishing typically provides a higher material removal rate and a higher chemical selectivity in relation to the insulator and base lead materials than that of collector substrate 720. The amount of insulator and base lead materials removed at any location on the work-in-progress is a direct function of the cumulative movement of the polishing pad over the substrate surface, the pressure at the substrate/polishing pad interface, and the slurry. Where all other factors remain unchanged, the greater the cumulative movement between the substrate and the polishing pad, the greater the amount of material removed from the substrate surface.

Note that any alternative suitable removal process, such as a wet etching process, a reactive ion etching (RIE) process, or an ion milling process may be utilized in lieu of the CMP process of step 610 of FIG. 6 in order to remove materials from top surface 1080 of elevated region 770.

Figure 11:
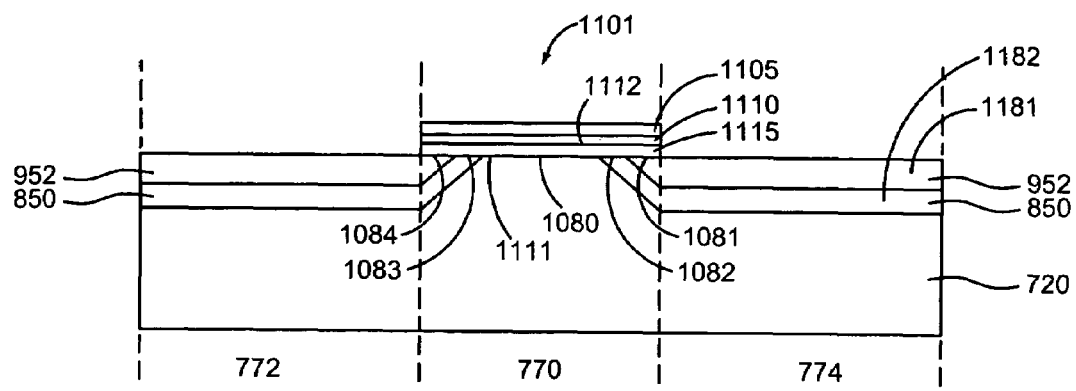
FIG. 11 is the fifth in a series of ABS illustrations of FIGS. 7-11 of partially fabricated TTM structures corresponding to the steps described in the flowchart of FIG. 6, showing a sensor stack structure formed over the elevated region, the sensor stack structure having an emitter region and a base region formed over an end of the base lead layer.

Referring to FIG. 10, a lithographic formation process 1090 is then performed in-situ to form, over elevated region 770, a sensor stack structure 1101 (step 612 of FIG. 6). Sensor stack structure 1101 includes an emitter region 1105 and a base region 1115. Step 612 is performed such that a portion of base region 1115 is formed over at least end 1081 of base lead layer 952. Preferably, this portion of base region 1115 is formed in contact with end 1081 of base lead layer 952. In FIG. 11, a partially manufactured TTM of the present application is shown. The partially manufactured TTM of FIG. 11 may incorporate a SVT (where all the magnetic layers are included between the Schottky and the tunnel barriers), or alternatively incorporate a magnetic tunnel transistor (MTT) (where one of the magnetic layers is within the emitter itself).

The partially manufactured TTM shown in FIG. 11 includes base region 1115, collector substrate 720 which is adjacent base region 1115, emitter region 1105, and a barrier region 1110 which separates emitter region 1105 from base region 1115. Base region 1115 preferably includes at least one soft ferromagnetic (FM) material, such as nickel-iron (NiFe), cobalt-iron (CoFe), or cobalt (Co), as well as a very thin metal (e.g. Cu) which is formed within the FM materials. Base region 1115 is generally formed to a thickness within 45 Å and 120 Å. In SVT configurations, emitter region 1105 preferably includes metallic materials such as Ta or Au. In MTT configurations, emitter region 1105 preferably includes at least one magnetic material such as NiFe, CoFe, or Co. Emitter region 1105 is generally formed to a thickness within 4 nm and 20 nm. Barrier layer 1110 is a non-magnetic insulating material, preferably made of $Al_2O_3$, which is generally less than 1 nm in thickness. As described in relation to FIG. 7, collector region 720 may be a semiconductor substrate made of silicon (Si). Sensor stack structure 101 is generally formed to a total thickness within 10 nm and 25 nm.

Figure 12:
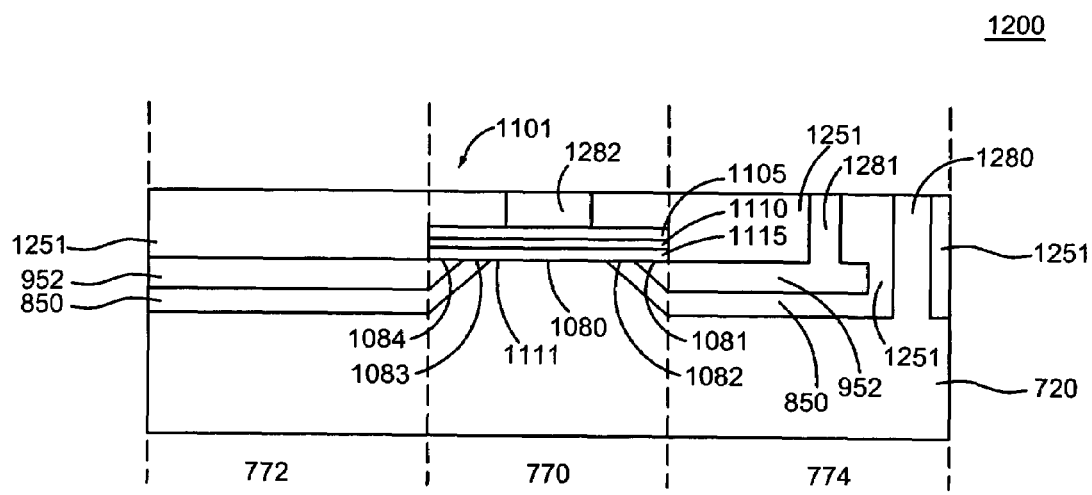
FIG. 12 is an ABS illustration showing a TTM of the exemplary embodiment of the present application.

The method corresponding to the steps described in the flowchart of FIG. 6 ends at an end block 614, however additional processing steps are subsequently performed to complete the manufacture of a TTM 1200 of FIG. 12. These processes may utilize any suitable techniques known in the art (conventional or otherwise) to complete the manufacturing per the design requirements.

For example, conductive vias 1280, 1281, and 1282 for collector substrate 720, base region 1115, and emitter region 1105, respectively, are then formed. For collector substrate conductive via 1280, a via hole is formed in recessed region 770 to expose underlying collector substrate materials of collector substrate 720 adjacent the location of the removed base lead materials. Conductive materials are then formed in the via hole to form collector substrate conductive via 1280 coupled to the exposed collector substrate materials. To achieve suitable coupling, a doping process may be performed prior to the sensor formation at the via site for collector conductive via 1280 in recessed region 770. This doping process may specifically be performed just prior to the formation of the insulator layer described in relation to FIG. 8 (i.e. step 606 of FIG. 6). This doping process is achieved either by a combination of solid state diffusion or ion-implantation and rapid thermal annealing. The dopant ions are made from any suitable chemical species to form a highly-doped n-type region in the semiconductor substrate. The highly-doped via site region helps provide a physical contact point for subsequently formed collector conductive via 1280.

For base region conductive via 1281, a via hole is formed in recessed region 774 to expose underlying base lead materials of base lead layer 952. Conductive materials are then formed in the via hole to form base region conductive via 1281 coupled to the exposed base lead materials. For emitter region conductive via 1282, conductive materials are formed at least partially over emitter region 1105 to form emitter region conductive via 1282.

Figure 13:
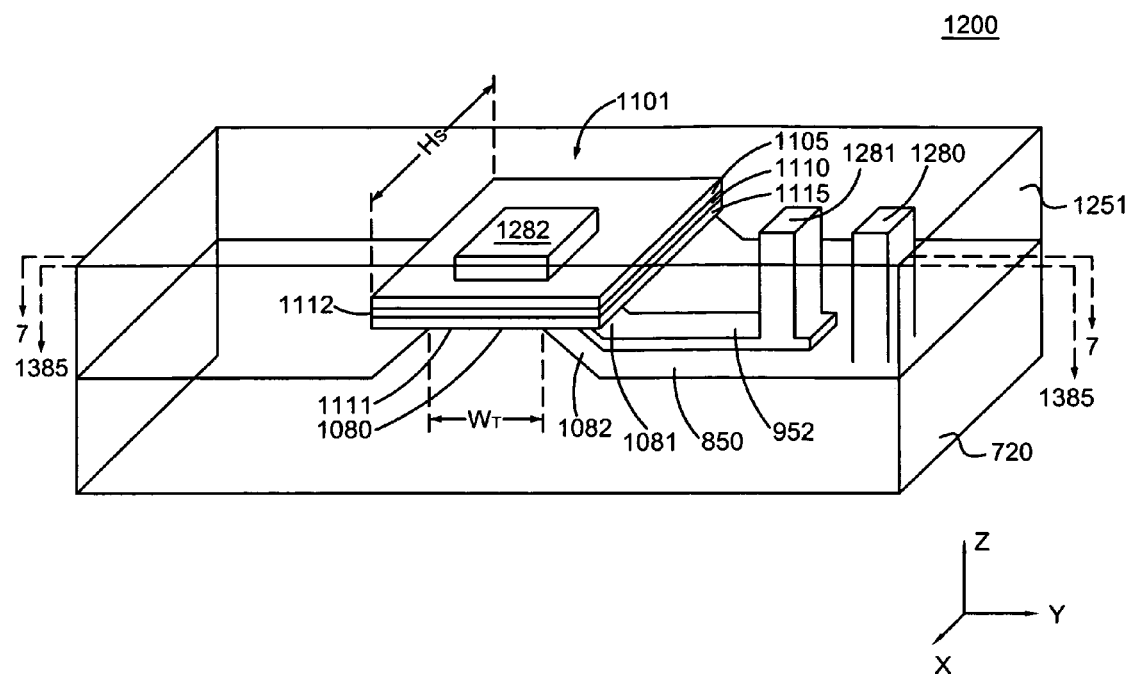
FIG. 13 is an isometric view of the TTM of the exemplary embodiment of FIG. 12, revealing exemplary trackwidth and stripe height dimensions.

As indicated in FIG. 13, a trackwidth $W_T$ of TTM 1200 is defined by the dimension of top surface 1080 of elevated region 770 along the y-axis, while a stripe height $H_S$ of the magnetic head is defined by the dimension of emitter region 1105 along the x-axis. A sensing plane 1385 of TTM 1200 is defined along sides of base region 1115, collector substrate 720, and emitter region 1105. This sensing plane 1385 is an air bearing surface (ABS) when TTM 1200 is embodied in a magnetic head. Emitter conductive via 1282, which may be embodied as a ferromagnetic (FM) shield for TTM 1200, is positioned in contact with emitter region 1105 behind sensing plane 1385 along line 7-7. Emitter conductive via 1282 serves as the electrical connection for emitter region 1105 to an external lead (not visible in FIG. 12). Collector substrate conductive via 1280 is coupled with underlying collector substrate materials of collector substrate 720 in recessed region 774 behind sensing plane 1385 along line 7-7. Base lead layer 952 is positioned over insulator layer 850, in-plane with semiconductor materials of elevated region 770, and behind sensing plane 1385 along line 7-7. Sensor stack structure 1101 having emitter region 1105 and base region 1115 formed over end 1081 of base lead layer 952 is positioned at sensing plane 1385. Base lead layer 952, its conductive via 1281, and collector substrate conductive via 1280 are preferably not formed along sensing plane 1385. Note that additional or alternative leads may be formed in the TTM, which has at least three leads. Furthermore, on-board electronics may be formed on collector substrate 720 near sensor stack structure 1101.

During operation of the TTM, hot electrons are emitted from emitter region 1105 to travel through to base region 1115 to reach collector region 720, which collects the magnetocurrent (i.e. collects the electrons). In operation, the device acts as a hot spin electron filter whereby barrier region 1110 between emitter region 1105 and base region 1115 operates to selectively allow the hot electrons to pass on through to base region 1115 and then on through collector region 720. When TTM 1200 is not functioning, the device is in a known magnetic quiescent state. In this case, the magnetization of the free layer which comprises all or part of base region 1115 is parallel to the ABS plane. The direction of this magnetization depends on the direction of the magnetic field produced by a pinned layer (not visible) formed adjacent the free layer. The scattering of electrons within the free layer is dependent upon the orientation of the magnetization within the free layer. For example, if the magnetization is pointing in the parallel direction relative to the pin layer (i.e. parallel to the ABS plane), then the electrons are not scattered as much as compared to the case where the free layer is antiparallel relative to the pin layer. The performance of the device may be different depending upon the relative configuration of emitter region 1105, the free layer, and the hard bias layer.

Advantageously, the base conductive via 1281 formation may occur without causing damage to sensor stack structure 1101. Also, base lead layer 952 is formed in recessed region 774 of collector substrate 720 prior to formation process 1090 of sensor stack structure 1101 such that TTM 1200 may be entirely in-situ manufactured. Furthermore, trackwidth $W_T$ of TTM 1200 may be defined directly between the edges of top surface 1080 of elevated region 770 of collector substrate 720. TTM 1200 is suitable for incorporation into nanoscale devices which increase areal recording densities, therefore aiding the revolution in magnetic storage.

Other alternatives and additions to the method described in relation to FIG. 6 will now be discussed. As described in relation to FIG. 7, a resist structure is utilized in the formation of the collector substrate having the elevated region and the recessed region (see step 604 of FIG. 6). After this formation, the resist structure is removed prior to the formation of the insulator layer (see step 606 of FIG. 6) and the base lead layer (see step 608 of FIG. 6). Alternatively, however, the resist structure need not be removed prior to the formation of the insulator layer and the base lead layer. Instead, the insulator layer and the base lead layer may be formed over the collector substrate with the resist structure in place. The resist structure is then removed by a CMP liftoff process to expose the top surface of the elevated region of the collector substrate. In general, the mechanical interaction of a CMP pad during the CMP liftoff process removes the resist structure from the surface of the layer underneath it. Here, the CMP pad makes physical contact with the resist structure (i.e. the resist structure having the insulator and base lead layer material formed thereon) and compresses it until the CMP pad reaches the top surface of the elevated region. A protective or etch stop layer may be provided over the top surface in conjunction with the CMP lift-off process. The protective layer, if provided, is formed over the elevated region prior to the formation of the insulator layer (i.e. step 606 of FIG. 6) and the base lead layer (i.e. step 608 of FIG. 6). This protective layer may be formed to a thickness between about 100 Å and 200 Å. The protective layer may be any suitable material, such as carbon. This carbon may be sputtered carbon, diamond-like carbon (DLC), or cathodic arc, as examples. The protective layer help provide a physical barrier to protect the collector substrate at the elevated region from the subsequent deposition of the insulator layer and the base lead layer. The CMP lift-off process may persist to remove the entire protective layer, or alternatively, only a very thin layer of the protective layer.

In a further alternative, the insulator layer described in relation to FIG. 8 is a first insulator layer and a second insulator layer is formed over the base lead layer prior to the CMP process described in relation to FIG. 10 (step 610 of FIG. 6). This second insulator layer is formed similarly to the first insulator layer.

Final Comments. As described herein, a collector substrate having an elevated region and a recessed region adjacent the elevated region is provided. An insulator layer is formed in full-film over the collector substrate, and a base lead layer is formed in full-film over the insulator layer and in-plane with semiconductor materials of the elevated region. The insulator materials and the base lead materials that are formed over the elevated region are removed. A sensor stack structure having an emitter region and a base region is then formed over the elevated region such that part of the base region is formed over an end of the base lead layer. A base conductive via may be formed to contact base lead materials of the base lead layer at a suitable distance away from the sensor stack structure. Advantageously, the base conductive via formation may occur without causing damage to the sensor stack structure. Also, the base lead layer is formed in the recessed region of the collector substrate prior to the formation of the sensor stack structure such that the TTM may be entirely in-situ manufactured. Furthermore, the trackwidth of the TTM may be defined directly by the elevated region of the collector substrate. The TTM is suitable for incorporation into nanoscale devices which increase areal recording densities, therefore aiding the revolution in magnetic storage. The TTM may comprise an SVT or an MTT, as examples.

A TTM of the present application which is suitable for use in a magnetic head has a collector substrate having an elevated region and a recessed region adjacent the elevated region. An insulator layer is formed over the recessed region and a base lead layer is formed over the insulator layer in-plane with semiconductor materials of the elevated region. A sensor stack structure is formed over the elevated region. The sensor stack structure has an emitter region and a base region, where the base region is formed over an end of the base lead layer.

A disk drive of the present application includes a slider, a magnetic head carried on the slider, a write head portion of the magnetic head, and a read head portion of the magnetic head which includes a TTM. The TTM has a collector substrate having an elevated region and a recessed region adjacent the elevated region. An insulator layer is formed over the recessed region, and a base lead layer is formed over the insulator layer in-plane with semiconductor materials of the elevated region. A sensor stack structure is formed over the elevated region. The sensor stack structure has an emitter region and a base region, where the base region is formed over an end of the base lead layer.

It is to be understood that the above is merely a description of preferred embodiments of the invention and that various changes, alterations, and variations may be made without departing from the true spirit and scope of the invention as set for in the appended claims. For example, although the TTM is described as a three-leaded device, it may actually have three or more leads. Few if any of the terms or phrases in the specification and claims have been given any special particular meaning different from the plain language meaning to those ordinarily skilled in the art, and therefore the specification is not to be used to define terms in an unduly narrow sense.

What is claimed is:

1. A method of making a three terminal magnetic sensing device comprising the steps of:
    providing a collector substrate having an elevated central region and a recessed side regions adjacent the elevated central region, the elevated central region comprising a top surface surrounded by angled sidewalls;
    forming a first insulator layer over the recessed side regions and the angled sidewalls of the elevated central region;

forming a base lead layer over the first insulator layer in the recessed side regions and the angled sidewalls of the elevated central region, the base lead layer being formed in-plane with the elevated central region;

forming, over the elevated central region, a sensor stack structure having an emitter and a base, the base being absent from the recessed side regions, the base having an end which is formed on top of and in contact with an end of the base lead layer in the elevated central region over one of the angled sidewalls;

forming, in one of the recessed side regions, a second insulator layer over the base lead layer and adjacent the sensor stack structure; and forming, in the one recessed side region, a conductive base lead in a via hole through the second insulator layer down to the base lead layer.

2. The method of claim 1, wherein the steps are performed in-situ.

3. The method of claim 1, wherein the step of providing the collector substrate further comprises the steps of:

forming a resist structure over a central region of the collector substrate which exposes collector substrate materials over a side of the collector substrate; and etching, with the resist structure in place, to remove the exposed collector substrate materials to thereby form the recessed side regions and the elevated central region.

4. The method of claim 1, further comprising the steps of:
forming a resist structure over the elevated central region;
wherein the steps of forming the first insulator layer and the base lead layer comprise the further steps of depositing the first insulator layer and the base lead layer over the collector substrate with the resist structure in place; and
removing the resist structure.

5. The method of claim 1, further comprising the steps of:
wherein the steps of forming the first insulator layer and the base lead layer comprise the further steps of depositing the first insulator layer and the base lead layer in full-film over the collector substrate; and
removing insulator materials and base lead materials deposited over the elevated central region.

6. The method of claim 1, further comprising the steps of:
wherein the steps of forming the first insulator layer and the base lead layer comprise the further steps of depositing the first insulator layer and the base lead layer in full-film over the collector substrate; and
performing a planarization process to remove the insulator materials and the base lead materials formed over the elevated central region.

7. The method of claim 1, wherein the width of the base is no greater than the width of the emitter.

8. The method of claim 1, further comprising the steps of:
forming an etch stop layer over the elevated central region.

9. The method of claim 1, wherein at least the end of the base lead layer is formed coplanar with the top surface of the elevated central region.

10. The method of claim 1, further comprising the steps of:
forming the via hole in the recessed side regions to expose underlying base lead materials of the base lead layer; and
forming conductive materials in the via hole to form the conductive base lead.

11. The method of claim 10, further comprising the step of: performing a doping process in the recessed side regions.

12. A method of making a three terminal magnetic sensing device comprising the steps of:
providing a collector substrate having an elevated central region and a recessed side regions adjacent the elevated central region, the elevated central region comprising a top surface surrounded by angled sidewalls;

forming a first insulator layer in full-film over the collector substrate;

forming a base lead layer in full-film over the first insulator layer and in-plane with semiconductor materials of the elevated central region;

removing the insulator materials and the base lead materials formed over the top surface of the elevated central region, thereby leaving insulator materials and base lead materials over the recessed side regions and the angled sidewalls of the elevated central region;

forming, over the elevated central region, a sensor stack structure having an emitter and a base, the base being absent from the recessed side regions, the base having an end formed on top of and in contact with an end of the base lead layer in the elevated central region over one of the angled sidewalls;

forming, in one of the recessed side regions, a second insulator layer over the base lead layer and adjacent the sensor stack structure;

forming a via hole through the second insulator layer in the one recessed side region to expose underlying base lead materials of the base lead layer; and forming conductive materials in the via hole to form a conductive base lead down to the base lead layer.

13. The method of claim 12, wherein the steps of forming the insulator and base lead layers are performed in-situ.

14. The method of claim 12, wherein the step of providing the collector substrate further comprises the steps of:

forming a resist structure over the elevated central region of the collector substrate which exposes collector substrate materials over a side of the collector substrate; and etching, with the resist structure in place, to remove the exposed collector substrate materials to thereby form the recessed side regions and the elevated central region.

15. The method of claim 12, wherein the end of the base lead layer is formed coplanar with the top surface of the elevated central region.

16. The method of claim 12, wherein the act of removing comprises the further act of performing a planarization process.

17. The method of claim 16, further comprising the steps of:

forming, prior to the steps of forming the insulator layer and the base lead layer, an etch stop layer over the elevated central region.

18. The method of claim 12, further comprising the step of:
wherein the act of removing comprises the further act of performing a chemical-mechanical polishing (CMP) process.

19. The method of claim 12, wherein the width of the base is no greater than the width of the emitter.

20. A three terminal magnetic sensing device comprising:
a collector substrate having an elevated central region and a recessed side regions adjacent the elevated central region, the elevated central region comprising a top surface surrounded by angled sidewalls;
a first insulator layer formed over the recessed side regions and the angled sidewalls of the elevated central region;
a base lead layer formed over the insulator layer in the recessed side regions and the angled sidewalls of the elevated central region, the base lead layer being in-plane with the elevated region;

a sensor stack structure formed over the top surface of the elevated central region and having an emitter and a base, the base being absent from the recessed side regions;

the base having an end which is formed on top of and in contact with an end of the base lead layer in the elevated central region over one of the angled sidewalls;

a second insulator layer formed over the base lead layer in one of the recessed side regions and being adjacent the sensor stack structure; and a conductive base lead formed through a via hole in the second insulator layer in the side region down to the base lead layer.

21. The three terminal magnetic sensing device of claim 20, wherein the width of the base is no greater than the width of the emitter.

* * * * *